US008885671B1

(12) United States Patent
Steinbach et al.

(10) Patent No.: US 8,885,671 B1
(45) Date of Patent: Nov. 11, 2014

(54) SYSTEM FOR COMPENSATING FOR PERIODIC NOISE IN TIME INTERLEAVED SYSTEM

(75) Inventors: Gunter Steinbach, Palo Alto, CA (US); Valentin Abramzon, Palo Alto, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 747 days.

(21) Appl. No.: 12/879,369

(22) Filed: Sep. 10, 2010

(51) Int. Cl.
*H04J 3/06* (2006.01)
(52) U.S. Cl.
USPC ............ 370/516; 370/518; 713/503
(58) Field of Classification Search
CPC ............... H03L 7/0814; H04J 3/0685
USPC ......... 370/201, 202, 211, 267–269, 307–310, 370/329–333, 496–519; 713/400–503; 327/152–154, 156–161, 258, 291, 295
See application file for complete search history.

(56) References Cited

U.S. PATENT DOCUMENTS

| 6,337,590 | B1 * | 1/2002 | Millar ............................ 327/158 |
| 6,633,190 | B1 * | 10/2003 | Alvandpour et al. ......... 327/291 |
| 6,768,356 | B1 * | 7/2004 | Wu et al. ........................ 327/156 |
| 7,936,193 | B2 * | 5/2011 | Van Der Wel et al. ........ 327/156 |
| 2003/0155953 | A1 * | 8/2003 | Hirata et al. ................... 327/236 |
| 2008/0298476 | A1 * | 12/2008 | Bereza et al. .................. 375/257 |
| 2012/0027143 | A1 * | 2/2012 | Wang et al. .................... 375/354 |

* cited by examiner

*Primary Examiner* — Andrew Chriss
*Assistant Examiner* — Romani Ohri

(57) ABSTRACT

A system for compensating for periodic noise in a time interleaved system having multiple phases of interest includes a master clock path, a detection circuit and an actuator circuit. The master clock path is configured to receive an input clock and to output an output clock, each of the input and output clocks having periodically occurring interleaving periods. Each interleaving period includes timeslots corresponding to the phases of interest of the time interleaved system. The detection circuit is configured to receive the input and output clocks for each timeslot, and to detect periodic noise in the output clock introduced by the master clock path by comparing the received input and output clocks. The actuator circuit includes a controllable delay element configured to adjust a delay of the input clock through the master clock path to compensate for the periodic noise detected by the detection circuit for each timeslot.

16 Claims, 6 Drawing Sheets

SYSTEM FOR COMPENSATING FOR PERIODIC NOISE IN TIME INTERLEAVED SYSTEM

BACKGROUND

Time interleaved systems, such as a time interleaved analog-to-digital converter (ADC), are generally sensitive to noise at the interleaving frequency or at harmonics of the interleaving frequency. Such noise tends to destroy matching of the interleaved circuits in both the amplitude and time domains. Removal of noise at the interleaving frequency or at harmonics of the interleaving frequency therefore improves performance of the time interleaved systems.

Conventional noise removal techniques employ a digital subharmonic filter, for example, at the output of the time interleaved system. The digital subharmonic filter attempts to remove the effects of subharmonic noise from the conversion product. However, subharmonic filters are expensive in terms of power and silicon area.

SUMMARY

In a representative embodiment, a system for compensating for periodic noise in a time interleaved system having multiple phases of interest includes a master clock path, a detection circuit and an actuator circuit. The master clock path is configured to receive an input clock and to output an output clock, each of the input clock and the output clock having periodically occurring interleaving periods, each interleaving period including timeslots corresponding to the phases of interest of the time interleaved system. The detection circuit is configured to receive the input clock and the output clock for each timeslot, and to detect periodic noise in the output clock introduced by the master clock path by comparing the received input clock and the received output clock. The actuator circuit includes a first controllable delay element configured to adjust a delay of the input clock through the master clock path compensating for the periodic noise detected by the detection circuit for each timeslot.

In another representative embodiment, a system for compensating for periodic noise in a time interleaved system having multiple phases includes a master clock path, a phase detector, a demultiplexer, multiple processing slices and a multiplexer. The master clock path is configured to receive an input clock at a master clock input and to output an output clock at a master clock output, the master clock path including a controllable delay element and a clock driver, each of the input clock and the output clock including multiple interleaving periods having multiple timeslots respectively corresponding to the multiple phases. The phase detector is configured to receive the input clock from the master clock input and the output clock from the master clock output, and to output a multiplexed detection signal including multiple detection signals corresponding to the multiple timeslots based on comparisons of the input clock and the output clock. The demultiplexer is configured to demultiplex the multiplexed detection signal to provide the multiple detection signals corresponding to the multiple timeslots. The processing slices correspond to the multiple timeslots, each processing slice including a counter that increments or decrements a corresponding count based on the corresponding detection signal. The multiplexer is configured to multiplex the counts from the multiple processing slices, and to output a multiplexed signal that adjusts a delay of the controllable delay element for each timeslot to compensate for the periodic noise in the timeslot.

In another representative embodiment, a compensating system is provided for compensating for periodic noise in a time interleaved system having multiple phases, the time interleaved system receiving a supply or bias voltage through a supply or bias line. The compensating system includes a digital-to-analog converter (DAC) coupled to the supply or bias line through at a first node, and a comparator coupled to the supply or bias line at a second node and connected to a master clock input, the comparator being configured to sample the supply voltage using an input clock from the master clock input and to output comparator signals indicating detected variations in the supply or bias voltage corresponding to timeslots of the input clock, which respectively correspond to the phases. The system further includes multiple processing slices corresponding to the timeslots, each processing slice having a counter that increments or decrements a corresponding count based on the corresponding comparator signal. The system further includes a multiplexer configured to multiplex the counts from the processing slices, and to output a multiplexed signal to the DAC, which converts the multiplexed signal to analog signals applied to the supply or bias line at the first node to compensate for the detected variations in the supply voltage corresponding to each timeslot.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
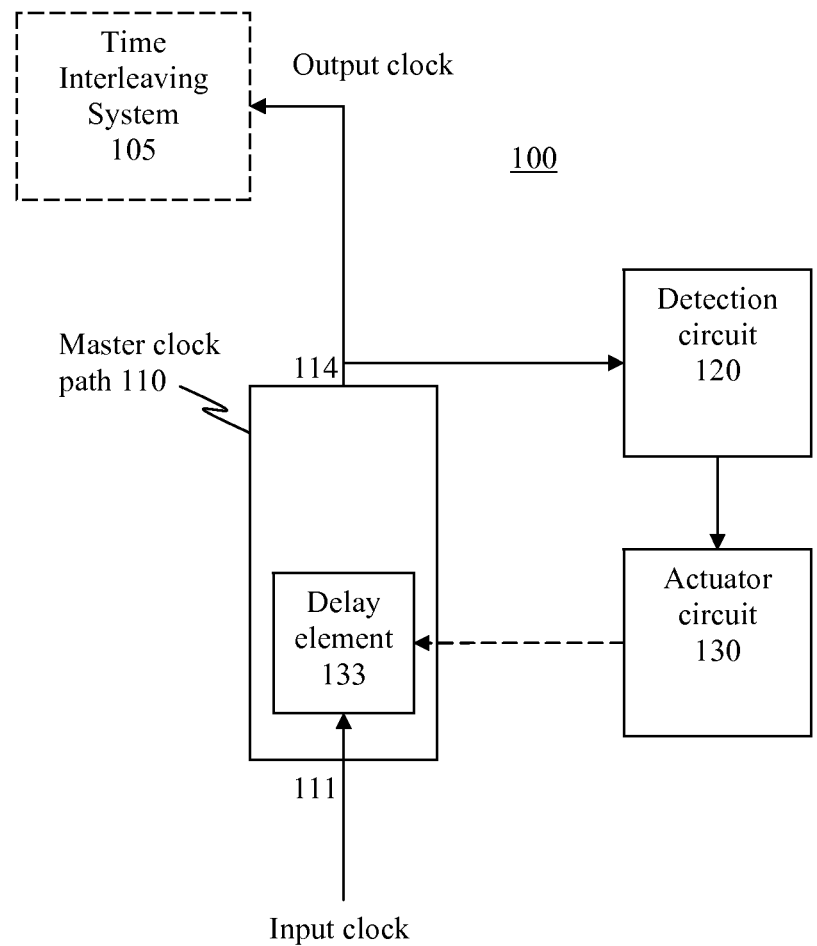
FIG. 1 is a block diagram showing a system for compensating for periodic noise in a time interleaved system, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Various embodiments provide systems for removing periodic noise at predictable frequencies from systems that are sensitive to systematic periodic disturbances, such as time interleaved systems, discussed above. More particularly, the various embodiments reduce the effects of subharmonic noise, which is noise at submultiples of a compound clock rate, such as jitter. For example, subharmonic noise includes noise at the interleaving frequency and its harmonics. The periodic noise is removed before it impacts system performance.

FIG. 1 is a block diagram showing a system for compensating for periodic noise in the clock of a time interleaved system, according to a representative embodiment.

Referring to FIG. 1, noise compensation system 100 reduces and/or removes noise, such as jitter or other subharmonic noise, from a master clock provided to representative time interleaved system 105. The time interleaved system 105 may be a first-rank sample-and-hold circuit of an ADC, for example, although the embodiments described herein may apply to any type of time interleaved system 105 requiring a low jitter clock.

The noise compensation system 100 includes master clock path 110, detection circuit 120 and actuator circuit 130. The actuator circuit 130 includes delay element 133 located within the master clock path 110, which may be a digitally controlled delay element. The master clock path 110 receives an input clock at master clock input 111 and outputs a periodic error compensated, low-jitter output clock at the master clock output 114, which is provided to the time interleaved system 105. Generally, the detection circuit 120 is configured to detect jitter, e.g., introduced by elements of the master clock path 110, in the output clock at the master clock output 114. The actuator circuit 130 implements appropriate corrective action to compensate for the jitter detected by the detection circuit 120. For example, the actuator circuit 130 adjusts the amount of delay introduced by the delay element 133 in order to advance or retard clock cycles of the input clock. Such correction is technically feasible because the jitter is assumed to be periodic, and therefore detection and correction of the jitter can be separated in time by one or more whole interleaving periods. An alternative embodiment does not detect and compensate for timing jitter directly, but rather detects and compensates for noise on a supply or bias node which, if left untreated, would cause timing jitter on the system clock.

Each clock cycle is associated with a timeslot, which corresponds to one of multiple phases of interest of the time interleaved system 105. The timeslots are periodic in that timeslots corresponding to a phase of interest are repeated in an interleaving period, determined by the total number phases of interest. For example, it may be assumed that the time interleaved system 105 is an N-way time interleaved system, where interleaving factor N is a positive integer greater than one indicating the number of phases of interest. Therefore, N adjacent clock cycles of the input clock (and the output clock) respectively correspond to the N timeslots corresponding to the N phases of interest, and the N clock cycles are in one interleaving period. In other words, timeslots corresponding to phase of interest i are repeated every N clock cycles, where i is a positive integer that consecutively increments from i=1 to N, and then repeats beginning again at i=1. For example, when N=8, there are 8 timeslots (corresponding to 8 clock cycles) in one interleaving period. Accordingly, the noise compensation system 100 is able to compensate separately for jitter in each set of like periodic timeslots by keeping track of and adjusting the corresponding clock cycles, as discussed in detail below.

Figure 6:
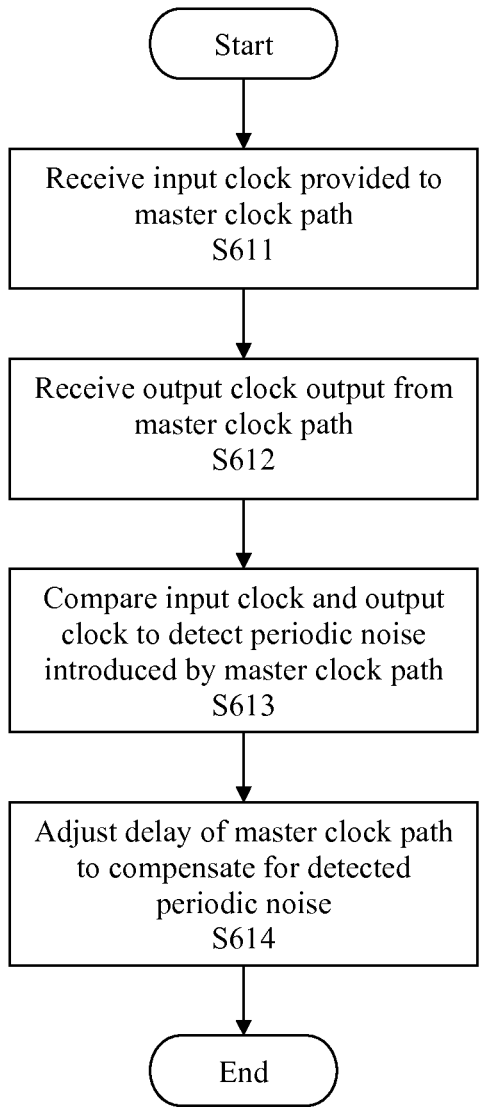
FIG. 6 is a flow diagram showing a method for compensating for periodic noise in a time interleaved system, according to a representative embodiment.

The noise compensation system 100 thus implements a method for compensating for periodic noise in a time interleaved system, such as the time interleaved system 105. FIG. 6 shows an example of such a method for compensating for periodic noise, according to a representative embodiment.

Referring to FIG. 6, an input clock provided to master clock path 110 is received in block S611 by detection circuit 120. The input clock has periodically occurring interleaving periods, where each interleaving period includes multiple timeslots corresponding to the phases of interest of the time interleaved system. An output clock, based on the input clock and output by the master clock path 110, is received in block S612 by the detection circuit 120. The output clock also has the periodically occurring interleaving periods, each of which includes the multiple timeslots. The received input clock and the received output clock for each timeslot are compared in block S613 to detect periodic noise in the output clock introduced by the master clock path 110. Comparing the received input clock and the received output clock may include sampling the input clock at a nominal transition point of a clock cycle, and comparing the sampled input clock with the same clock cycle in the output clock, as discussed below with reference to binary phase detector 221 in FIG. 2. In step S614, a delay of the master clock path 110 is adjusted by actuator circuit 130 to delay the input clock in order to compensate for the detected periodic noise for each timeslot.

As discussed above, the input clock may include multiple clock cycles corresponding to the multiple timeslots in each interleaving period, respectively. The delay of the master clock path 110 therefore may be adjusted for each clock cycle based on periodic noise detected in the corresponding timeslot.

Figure 2:
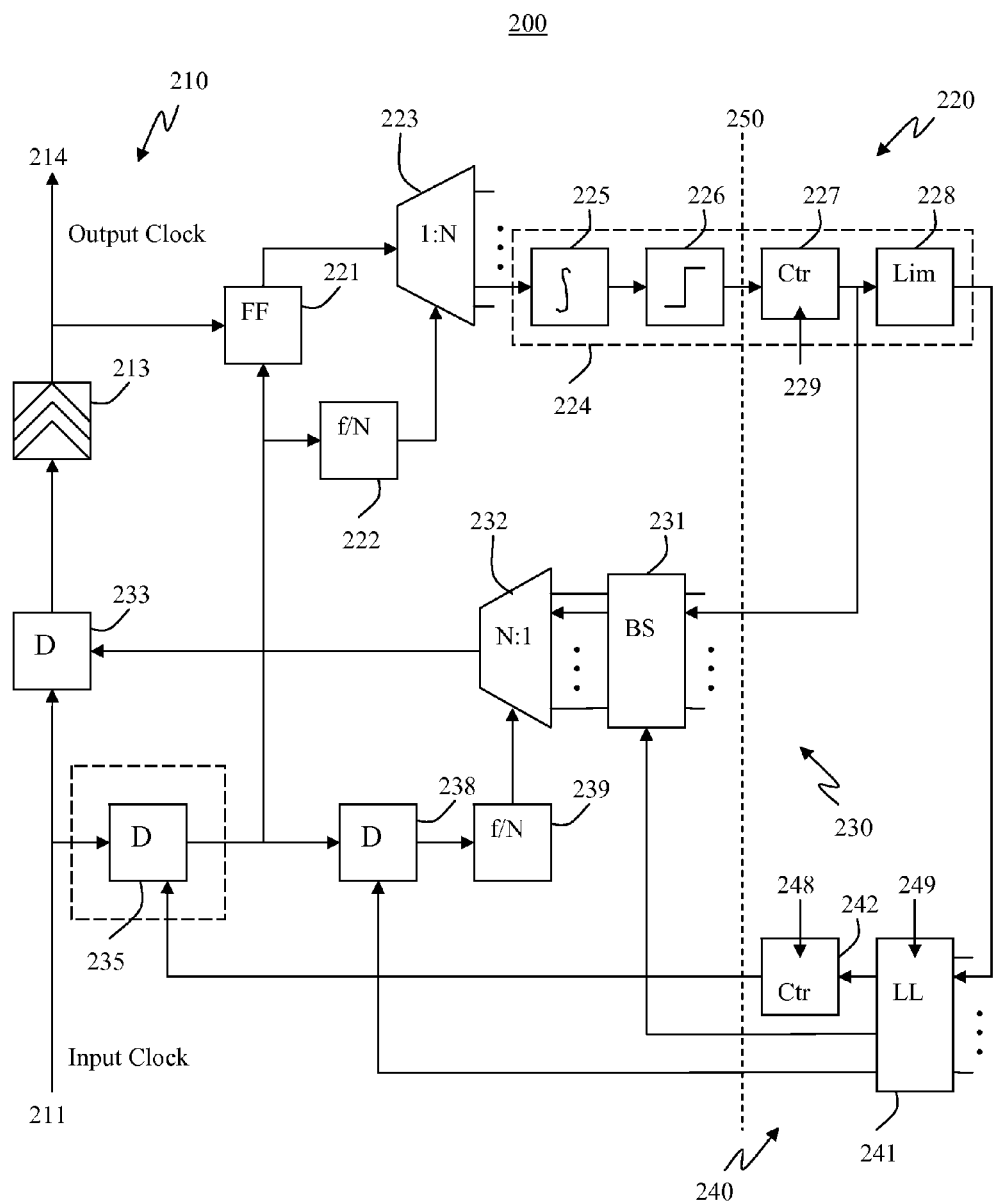
FIG. 2 is a block diagram showing a system for compensating for periodic noise in a time interleaved system, according to a representative embodiment.

FIG. 2 is a block diagram showing a system for compensating for periodic noise in a time interleaved system, according to a representative embodiment.

Referring to FIG. 2, a noise compensation system 200 reduces and/or removes noise, such as jitter or other subharmonic noise, from a master clock provided to a time interleaved system (not shown). The noise compensation system 200 includes master (full speed) clock path 210 of the time interleaved system, which receives an input clock at master clock input 211 and provides an output clock for controlling the time interleaved system at master clock output 214. The output clock is corrected, e.g., compensating for effects of jitter introduced in the master clock path 210, by operation of detection circuit 220, actuator circuit 230 and control circuit 240, discussed in detail below.

The input clock passes from the master clock input 211, through delay element 233 of the actuator circuit 230 (but located in the master clock path 210) and clock driver 213 of the master clock path 210 to the master clock output 214. In various embodiments, the delay element 233 may be digitally controlled. The master clock output 214 provides a low-jitter output clock, which may be used by the time interleaved system.

The input clock has frequency f1. For purposes of explanation, it is assumed that the input clock entering at the master clock input 211 is clean, and that delay element 233 and clock driver 213 introduce jitter due to periodic noise at the interleaving frequency or at harmonics of the interleaving frequency in the time interleaved system. For example, the periodic noise may be introduced on the supply or on the substrate of an integrated circuit chip of the time interleaved system. Generally, the noise compensation system 200 removes jitter by detecting the presence of jitter (at each timeslot) and modulating the delay of the delay element 233 to compensate for the detected jitter.

In the depicted representative embodiment, the jitter introduced by the delay element 233 and the clock driver 213 is detected by binary phase detector 221, f/N clock divider 222, 1:N demultiplexer 223 and processing slices 224 of detection circuit 220. The binary phase detector 221 may be implemented using an edge triggered D flip-flop, for example, although other types of phase detectors may be incorporated without departing from the scope of the present teachings. As shown, the binary phase detector 221 includes a first (data) input that receives the input clock from the master clock input 211 (via delay element 235, discussed below), and a second (clock) input that receives the output clock from master clock output 214. Of course, in alternative implementations, the first (data) input of the binary phase detector 221 may receive the output clock from the master clock output 214, and the second (clock) input may receive the input clock (via delay element 235) from master clock input 211, without departing from the scope of the present teachings.

The binary phase detector 221 detects jitter in each timeslot of the N interleaved timeslots of the output clock, using the output clock to sample the clean input clock at the master clock input 211. In an embodiment, the binary phase detector 221 may sample the input clock at nominal transition points (e.g., where the input clock is expected to transition from low to high or from high and low), so that it is able to detect when edges occur before or after the transition points. For example, the output of the binary phase detector 221 may correspond to the state of the first input at a rising edge of the second input. Therefore, the binary phase detector 221 outputs a high detection signal when the input clock is in a high state ("1") at the time the output clock transitions from low to high, indicating that the output clock lags the input clock. That is, the transition of the output clock occurs after the nominal transition point. Likewise, the binary phase detector 221 outputs a low detection signal ("0") when the input clock is in a low state at the time the output clock transitions from low to high, indicating that the output clock precedes the input clock. That is, the transition of the output clock occurs before the nominal transition point. When the transition of the output clock occurs at the same time as the transition of the input clock, the output of the binary phase detector 221 is random. Of course, in alternative implementations, the output of the binary phase detector 221 may correspond to the state of the first input at a falling edge of the second input, or at both rising and falling edges of the second input, without departing from the scope of the present teachings.

Thus, the binary phase detector 221 detects the jitter in each timeslot of the N interleaved timeslots by observing delays associated with the timeslots and comparing the timeslot delays with a nominal delay introduced by the delay element 233 and the clock driver 213. The binary phase detector 221 outputs a multiplexed detection signal that includes N detection signals corresponding to the N timeslots of interest of the time interleaved system.

In an embodiment, the input clock is delayed by delay element 235, which may be digitally controlled, before being provided to the first input of the binary phase detector 221. For convenience of explanation, the delay element 235 is depicted as belonging to actuator circuit 230, although it is understood that the delay element 235 also functions as part of the detection circuit 220. The delay element 235 may be protected from most of the effects of the periodic noise by supply filtering and shielding, for example, indicated by the dashed box surrounding the delay element 235. It is possible to better protect the delay element 235 than the clock driver 213 because the delay element 235 is a low-power circuit with small fan-out, while the clock driver 213 is generally a high-power driver covering a large area and driving a large fan-out. Also, the supply of the clock driver 213 generally cannot be filtered because it draws too much current.

The delay element 235 is configured to replicate, plus or minus whole clock cycles, the nominal delay introduced by the delay element 233 and the clock driver 213 in the master clock path 210. Therefore, the first and second inputs of the binary phase detector 221 (i.e., from the delay element 235 and the clock driver 213, respectively) are nominally in phase. Thus, any difference in phase detected by the binary phase detector 221 may be attributed to jitter. Timing errors of whole clock cycles are taken care of by barrel shifter 231, discussed below.

As discussed above, when there is no periodic jitter introduced in the master clock path 210 in a timeslot of the N interleaved timeslots (e.g., the input clock transitions from low to high or from high and low at the nominal transition point), the detection signal output by the binary phase detector 221 is a random sequence of zeroes and ones, which may be due to thermal noise and other types of noise. However, when periodic jitter is detected, the detection signal output by the binary phase detector 221 reflects the behavior of the jitter over time, effectively comparing each timeslot of the N interleaved timeslots in a corresponding clock cycle with the same timeslot in subsequent interleaving periods. For example, if evaluation of multiple interleaving periods indicates that the delay caused by the delay element 233 and the clock driver 213 is longer than the respective nominal delay during the first timeslot of the N interleaved timeslots (i.e., i=1), the binary phase detector 221 shows more zeros than ones in that timeslot over consecutive interleaving periods. Likewise, if the delay caused by the delay element 233 and the clock driver 213 is shorter than the respective nominal delay during the first timeslot of the N interleaved timeslots (i.e., i=1), the binary phase detector 221 shows more ones than zeroes in that timeslot.

In the depicted embodiment, the detection signals output by the binary phase detector 221 are demultiplexed by interleaving factor N using the f/N clock divider 222 and the demultiplexer 223. The f/N clock divider 222 provides an interleaving rate of f1/N, for example, where f1 is the frequency of the input clock, to control operation of the demultiplexer 223. The f/N clock divider 222 receives the input clock through the delay element 235, discussed above. The interleaving rate allows detection to be performed at every rising edge (or every falling edge) of the input clock. In an alternative embodiment, the detection may be performed at both rising and falling edges of the input clock (i.e., twice each clock cycle), in which case the f/N clock divider 222 would provide an interleaving rate of 2f1/N. Also, two binary phase detectors 221 would be required for the additional detection.

The N outputs of the demultiplexer 223 respectively drive N processing slices 224 corresponding to the N timeslots of the time interleaved system. Each of the processing slices 224 includes an integrator 225 (e.g., having a charge pump and a capacitor), a comparator 226, a counter 227 and a limit detector 228.

Referring to the representative processing slice 224 shown in FIG. 2, the integrator 225 integrates the demultiplexed detection signal received from the corresponding output of the demultiplexer 223. The integrated signal output by the integrator 225 increases as each consecutive detection signal indicates a high value, and decreases as each consecutive detection signal indicates a low value. The comparator 226 receives the integrated signal from the integrator 225, determines whether it is above or below a predetermined threshold (e.g., nominal or zero). The threshold may be a value substantially in the center of the range of the integrator 225, for example. Thus, in various embodiments, when the integrated signal is above the threshold, it is considered to be positive, and when the integrated signal is below the predetermined threshold, it is considered to be negative. The comparator 226 outputs a comparator signal having a state (e.g., positive or negative) corresponding to the determination.

The counter 227 increments or decrements based on the state of the comparator signal output by the comparator 226. That is, the counter 227 increments when the comparator signal indicates that the integrated signal is positive (above the threshold), and decrements when the comparator signal indicates that the integrated signal is negative (below the threshold). The counter 227 stops counting when it reaches the high end or low end of its range, i.e., it does not roll over. This occurs when a sufficient number of the periodically occurring timeslots in consecutive interleaving periods have had the same value (high or low) to indicate that the transitions of the corresponding clock cycles are consistently occurring early or late, as discussed above. The limit detector 228 detects when the counter 227 has reached the high or low limit of its range. The counter 227 is clocked by first slow clock 229, which has a frequency at least one decade below the interleaving rate f1/N.

Jitter detected in each of the N timeslots is removed by barrel shifter 231, N:1 multiplexer 232 and the delay element 235 of actuator circuit 230, based on the counter signals output by the N counters 227, respectively. The delay of the delay element 233 in the master clock path 210 is adjusted separately for each clock cycle of the input clock corresponding to the multiplexed output of the multiplexer 232, and thus for each timeslot of the time interleaved system, under control of the barrel shifter 231 and the multiplexer 232. That is, the delay element 233 is driven periodically to N different values in each interleaving period to provide correction for the periodic noise in each timeslot.

More particularly, the counter signals output by the N counters 227 are selected, e.g., in a round-robin fashion, by the barrel shifter 231 and the multiplexer 232 for controlling the delay of the delay element 233. The barrel shifter 231 is configured to shift the counter signals, as necessary, so that the counter signals from the counters 227 go to the proper inputs of the multiplexer 232. For example, if under nominal process, temperature and voltage (PVT) conditions, the delay in the master clock path 210 is more than three but less than four clock cycles, the barrel shifter 231 will shift the correspondence of processing slices and multiplexer inputs such that the counter signal corresponding to timeslot i controls delay element 233 at a time three clock cycles before the binary phase detector 221 senses the clock edge of timeslot i. The multiplexer 232 is controlled by f/N clock divider 239, which is clocked at the frequency f1 of the input clock provided through the delay element 235 (discussed above) and delay element 238. The delay element 238 is configured to further adjust delay of the input clock provided to the f/N clock divider 239, as needed to ensure proper placement of the correction signal within each timeslot, in response to control signals from the limit logic 241, discussed below. Of course, techniques other than rotating a barrel shifter may be incorporated to provide proper correlation of processing slices to multiplexer inputs, without departing from the scope of the present teachings, as would be apparent to one of ordinary skill in the art. For example, the state of the multiplexer 232 may be forced to be different from the state of the demultiplexer 223 by "swallowing cycles" in f/N clock divider 239 or f/N clock divider 222.

The timing of the delay changes of the delay element 233 is controlled because the effects of the delay changes are felt at the master clock output 214 and at the binary phase detector 221 only after propagation delay through the delay element 233 and the clock driver 213. This propagation delay may exceed a clock period and generally changes with temperature and supply voltage. Accordingly, the delays of the barrel shifter 231 and the delay element 238 may be adjusted such that the control signal for timeslot i is fed to the delay element 233 at exactly the right time for its effects to arrive at the binary phase detector 221 when it is sensing the jitter of timeslot i, and further such that the correction signal for timeslot i does not "spill over" into adjacent timeslots i+1 or i−1.

The delay in the delay element 235 is also controlled based on the counter signals output by the N counters 227, respectively, as discussed below. The delay in the delay element 235 is adjusted, so that the binary phase detector 221 nominally sees coincident edges at its first and second inputs (from the delay element 235 and the clock driver 213, respectively). When the delay element 235 is not at the correct setting, the inputs of the binary phase detector 221 are not nominally in phase. Therefore, the detection signals output by the binary phase detector 221 may not accurately reflect the effect of periodic jitter, but rather may simply show delay differences. That is, the detection signals in delay may incorrectly show high when the delay of the delay element 235 is too short, or low when the delay of the delay element 235 is too long, for example. The counters 227 in the N processing slices 224 would then driven to the same false limit, either high or low, in response.

Meanwhile, the limit detector 228 of each processing slice 224 signals a high or low limit indicator to combining limit logic 241 of control circuit 240, clocked by third slow clock 249. The control circuit 240 also includes counter 242, clocked by second slow clock 248. In various embodiments, the limit indicator from each processing slice 224 may include two bits for indicating which limit has been reached, if any. For example, when no limit has been reached with respect to the processing slice 224, the bits of the limit indicator may be "00." However, when a high limit has been reached, the bits of the limit indicator may be "10," and when a low limit has been reached, the bits of the limit indicator may be "01," for example. Of course, the limit indicators may have more or fewer bits, and may include different bit arrangements for indicating the various limits, without departing from the scope of the present teachings.

When the N limit detectors 228 all show either high or low limits, but not a mix of both, the limit logic 241 enables counter 242 to count, clocked by the third slow clock 249. For example, the counter 242 may count up in response to high limit indicators and count down in response to low limit indicators. The counter 242 continues to count until the limit indicators either stop showing limits altogether or stop showing consisting limits, meaning that the corresponding counters 227 are no longer at the high or low limit of their ranges, or are not all at the same limit. At that point the phase detector is sampling at the nominal transition point and the detector part of the invention is set up correctly. In order to keep the jitter correction loop stable, the frequency of the second slow clock 248 is at least one decade below the frequency of the first slow clock 229.

Generally, if the timing of the delay changes implemented by the multiplexer 232 is incorrect, then the delay adjustments to the delay element 233 in response to the counters 227 will have no effect or possibly make the periodic jitter worse. In that case, the integrators 225 will operate in open loops and the corresponding counters 227 will be stuck at their limits. The limits will be different for each processing slice 224 because, assuming the delay of the delay element 235 is correct, the detection signals output by the binary phase detector 221 are random with zero mean in the absence of periodic noise, and any periodic jitter will be always early in some timeslots and always late in others. Consequently, the outputs of the comparators 226 will be stuck, and the counters 227 will run into their limits, some high and some low.

Therefore, the limit detectors 228 in the processing slices 224 are configured to signal when the corresponding counters have reached their limits to the limit logic 241. When the limit logic 241 sees no limit indicators on its N inputs, it determines that the delay adjustments are effective for each of the N timeslots, and thus takes no corrective action. When the limit logic 241 sees all high limit indicators or all low limit indicators on its N inputs, it determines that the delay adjustments are ineffective, and also that the first input of the binary phase detector 221 is significantly off, i.e. the detector timing is not set up correctly, and thus provides a control signal to adjust the delay of the delay element 235 to compensate. When the limit logic 241 sees both high and low limit indicators on its N inputs, it determines that the delay adjustments are ineffective, i.e. the actuator timing is not set up correctly, and provides control signals for searching for a better delay setting for the delay element 238 and for a better state for the barrel shifter 231. In various embodiments, the searching performed under control of the limit logic 241 is by trial and error, based on the limit indicators provided by the limit detectors 228. The searches by the limit logic 241 are each clocked by the third slow clock 249. In order to keep the correction loop stable, the frequency of the third slow clock 249 is at least one decade below that of the second slow clock 248. Generally, when limit indicators are present, the limit logic 241 performs one or more of the adjustments discussed above with respect to one or more of the N timeslots, until the corresponding counters 227 are no longer stuck in the high or low limits.

Figure 5:
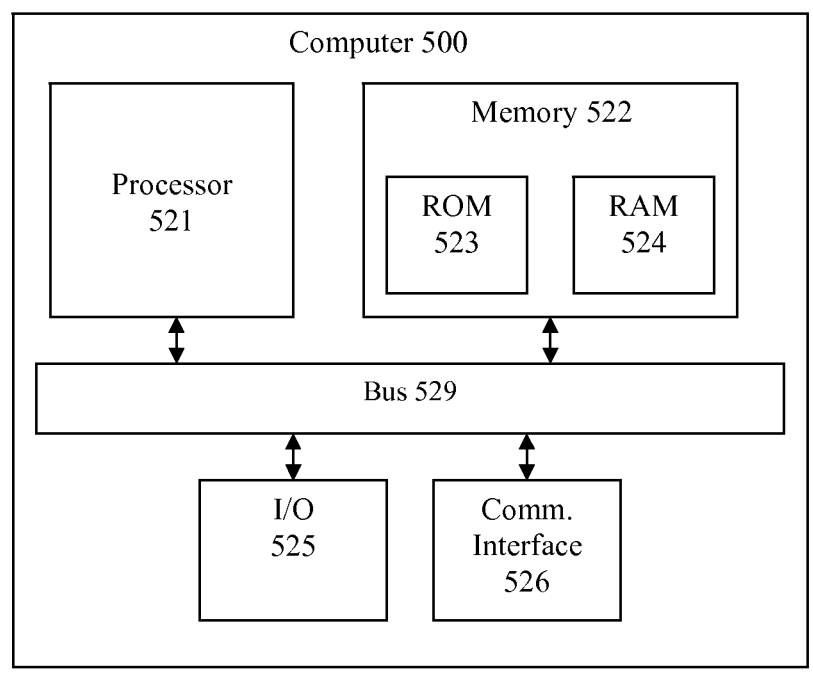
FIG. 5 is a functional block diagram showing an illustrative computer for performing detection and control functionality, according to a representative embodiment.

Notably, although depicted separately, the detection and control functionality performed by the elements to the right of dividing line 250 in FIG. 2, including the counters 227, the limit detectors 228, the limit logic 241 and the counter 242, may be implemented as logic, e.g., in software on a microcontroller core or off-chip in a computer, such as computer 500 shown in FIG. 5.

More particularly, FIG. 5 is a functional block diagram showing an illustrative computer 500 that executes all or a portion of processes for detecting periodic noise, such as jitter, and/or controlling adjustments for correct the detected periodic noise, according to a representative embodiment. The various "parts" shown in the computer 500 may be physically implemented using a software-controlled microprocessor, e.g., processor 521, hard-wired logic circuits, firmware, or a combination thereof. Also, while the parts are functionally segregated in the computer 500 for explanation purposes, they may be combined variously in any physical implementation.

In the depicted embodiment, the computer 500 includes processor 521, memory 522, bus 529 and various interfaces 525-526. The processor 521 is configured to execute one or more logical or mathematical algorithms, including the functionality of the counters 227, the limit detectors 228, the limit logic 241 and/or the counter 242 of the embodiments described herein, in conjunction with the memory 522. The processor 521 may be constructed of any combination of hardware, firmware or software architectures, and include its own memory (e.g., nonvolatile memory) for storing executable software/firmware executable code that allows it to perform the various functions. Alternatively, the executable code may be stored in designated memory locations within memory 522, discussed below. In an embodiment, the processor 521 may be a central processing unit (CPU), for example, executing an operating system, such as Windows operating systems available from Microsoft Corporation, NetWare operating system available from Novell, Inc., or Unix operating system available from Sun Microsystems, Inc. The operating system controls execution of other programs of the location computer 500.

The memory 522 may be any number, type and combination of nonvolatile read only memory (ROM) 523 and volatile random access memory (RAM) 524, and stores various types of information, such as computer programs and software algorithms executable by the processor 521 (and/or other components), e.g., to perform location determination processes of the embodiments described herein. As generally indicated by ROM 523 and RAM 524, the memory 522 may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like. Further, the memory 522 may store the predetermined boundaries one or more enterprise networks, as discussed above.

Further, input may be received from various other components (e.g., comparators 226) through communication interface 526, and communicated to the processor 521 and/or the memory 522 via bus 529. The type, number and arrangement of the network interfaces may vary without departing from the scope of the present teachings. In an embodiment, a user and/or other computers may interact with the computer 500 using various input device(s) through I/O interface 525. The input devices may include a keyboard, key pad, a track ball, a mouse, a touch pad or touch-sensitive display, and the like. Also, various information may be displayed on a display through a display interface (not shown), which may include any type of graphical user interface (GUI).

Figure 3:
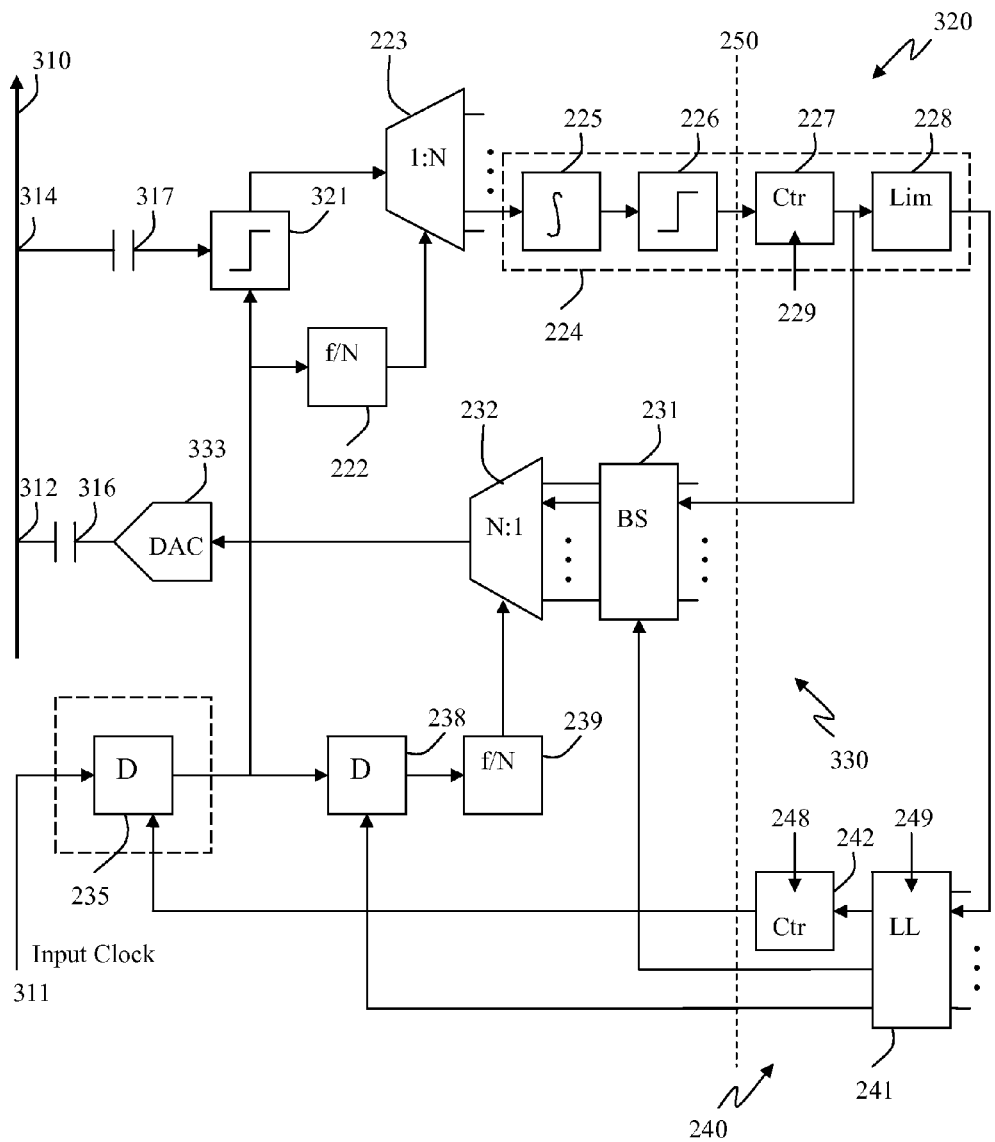
FIG. 3 is a block diagram showing a system for compensating for periodic noise in a time interleaved system, according to a representative embodiment.

FIG. 3 is a block diagram showing a system for compensating for periodic noise in a time interleaved system, according to another representative embodiment.

Referring to FIG. 3, a noise compensation system 300 reduces and/or removes noise, such as jitter or other subharmonic noise, from a sensitive supply or bias node, indicated by representative line 310, for example, providing power to a time interleaved system (not shown). The noise compensation system 300 receives an input clock at master clock input 311 for controlling the time interleaved system. Periodic noise, such as jitter caused by voltage variations on the line 310, is removed by operation of detection circuit 320, actuator circuit 330 and control circuit 240, discussed below.

More particularly, compensating signals are driven onto the line 310 by means of digital-to-analog converter (DAC) 333, which is AC coupled to the line 310 through first capacitor 316 at first node 312. The periodic noise in the supply or bias voltage is detected by comparator 321, which is also AC coupled to the line 310 through second capacitor 317 at second node 314. The comparator 321 is clocked by the clean, full-speed input clock, delayed through the delay element 235. As discussed above, the delay element 235 is configured to delay the clocked input to the comparator 321 and to the UN clock divider 239 under feedback control of the limit logic 241.

The comparator 321 detects variations in the supply or bias voltage in the line 310 corresponding to each timeslot of the N interleaved timeslots of the input clock, using the input clock to sample the supply or bias voltage at the second node 314. In an embodiment, the comparator 321 may sense the sign of the deviations (e.g., positive or negative) of the supply or bias voltage at the second node 314 from its mean (in mathematical terms, comparing the deviations to zero) at time instants given by the edges of the (delayed) input clock.

As a result of each comparison (sign determination), the comparator 321 outputs a high or low comparison signal to demultiplexer 223 of the detection circuit 320. The N outputs of the demultiplexer 223 respectively drive N processing slices 224 corresponding to the N timeslots of the time interleaved system. The remaining elements of the noise compensation system 300, including timing adjustment loops implemented by the actuator circuit 230 and the control circuit 240, function substantially as described above with reference to FIG. 2, and therefore the respective descriptions will not be repeated. However, the multiplexed output of the multiplexer 232 is input to the DAC 333, as opposed to a delay element, such as the delay element 233. The DAC 333 converts the multiplexed output to an analog signal that is applied to the supply or bias voltage at the first node 312 to compensate separately for the detected variations in each timeslot, and thus for each period of interest of the time interleaved system. That is, the DAC 333 is driven periodically to N different values in each interleaving period to provide correction for the periodic noise in each timeslot. As would be apparent to one skilled in the art, alternative embodiments may include various configurations for coupling the comparator 321 and/or the DAC 333 with the line 310, without departing from the scope of the present teachings. For example, the comparator 321 may be DC coupled to the second node 314 and compare the instantaneous voltage at the second node 314 to the long-term average of the voltage at this node, "long term" meaning significantly longer than an interleaving period (e.g., including at least 10 interleaving periods). Likewise, the DAC 333 may be DC coupled to a (on-chip) supply or bias regulator (not shown) directly, for driving the supply or bias regulator without being AC coupling to an actual line 310.

Notably, the embodiment depicted in FIG. 3 does not directly measure and correct jitter, as in the embodiment depicted in FIG. 2. Rather, the noise compensation system 300 measures and corrects variations in the supply or bias voltage, which would otherwise cause jitter.

Figure 4:
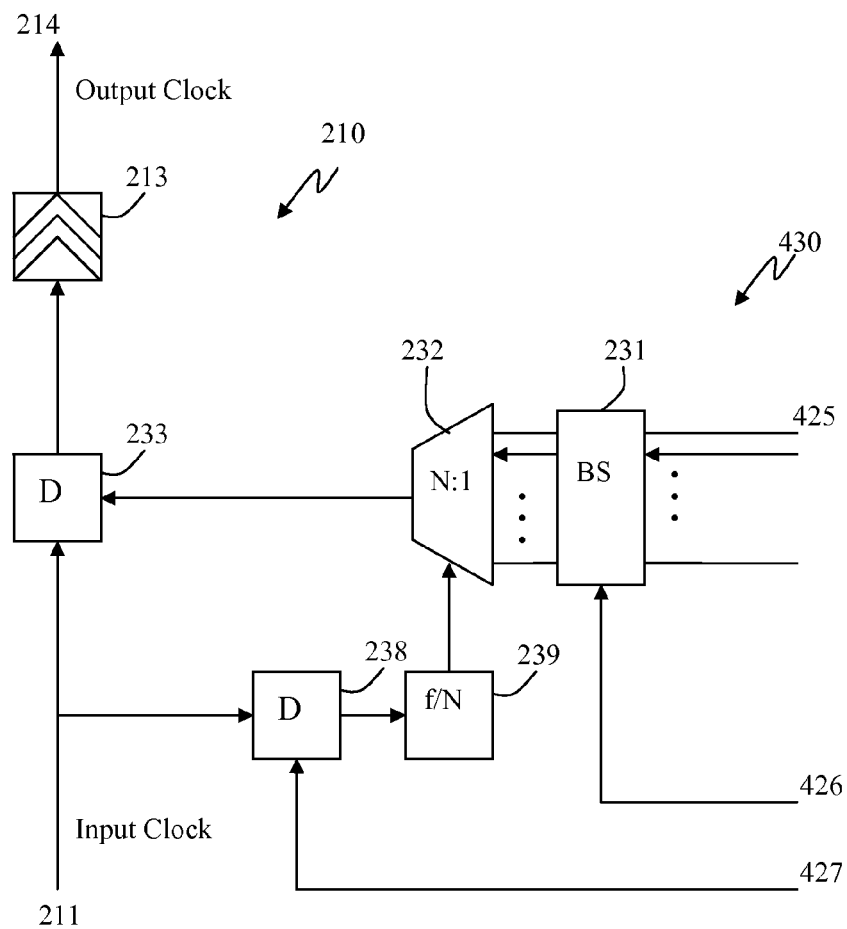
FIG. 4 is a block diagram showing a system for compensating for periodic noise in a time interleaved system, according to a representative embodiment.

FIG. 4 is a block diagram showing a system for compensating for periodic noise in a time interleaved system, according to another representative embodiment.

Referring to FIG. 4, a noise compensation system 400 reduces and/or removes noise, such as jitter or other subharmonic noise, from a master clock provided to a time interleaved system (not shown). The noise compensation system 400 includes master clock path 210, which receives an input clock at master clock input 211 and provides an output clock for controlling the time interleaved system at master clock output 214. The output clock is corrected, e.g., compensating for effects of jitter introduced in the master clock path 210, by operation of actuator circuit 430 and a post-processing output of the time interleaved system.

More particularly, the effects of subharmonic noise are measured by post-processing the time interleaved system output, either in background calibration mode or in the foreground using a known system input signal. The background calibration may fail for pathological input signals, such as input signals having spectral content at subharmonics of the input clock. The foreground calibration requires the time interleaved system to be taken off-line and a well characterized input signal to be applied.

The post-processing noise compensation system 400 generates N correction words at N inputs 425 to the barrel shifter 231. It also generates slice select control signal 426 for adjusting the state of the barrel shifter 231, and slice timing control signal 427 for adjusting the delay introduced by the delay element 238. The delay element 433 compensates timing jitter, as described above with FIG. 2, and therefore the descriptions of the respective elements will not be repeated. Inputs 425, 426 and 427 are derived from the post-processing circuitry, which includes various post-processing functions, such as determining N timeslot correction values and using the fact of the correction values hitting preset limits for deriving the proper placement of the correction signals within the interleaving period, replacing the hardware block described above.

In conventional approaches, post-processing the output of a time interleaved system to remove the effects of noise requires building in extra margin and redundancy. This is because, once the noise causes any point in the signal chain to exceed its range, the effects of the noise cannot be uniquely removed. In contrast, according to the various embodiments described herein, by removing noise before it degrades performance of the time interleaved system, the amount of redundancy and margins designed into the time interleaved system may be reduced, without adversely affecting performance or reliability.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

The invention claimed is:

1. A system for compensating for periodic noise in a time interleaved system having a plurality of phases of interest, the system comprising: a master clock path configured to receive an input clock and to output an output clock, each of the input clock and the output clock having periodically occurring interleaving periods, each interleaving period comprising a plurality of timeslots corresponding to the plurality of phases of interest of the time interleaved system;

a detection circuit configured to receive the input clock and the output clock for each timeslot, and to detect periodic noise in the output clock introduced by the master clock path by comparing the received input clock and the received output clock; and an actuator circuit comprising a first controllable delay element configured to introduce delay of the input clock in the master clock path and to adjust an amount of the delay of the input clock, compensating for the periodic noise detected by the detection circuit for each timeslot.

2. The system of claim 1, wherein the input clock comprises a plurality of clock cycles corresponding to the plurality of timeslots in each interleaving period, respectively, the actuator circuit adjusting the first controllable delay element for each clock cycle based on periodic noise detected in the corresponding timeslot.

3. The system of claim 2, wherein the detection circuit comprises a phase detector configured to sample the input clock at a nominal transition point of a clock cycle, and to compare the sampled input clock with the same clock cycle in the output clock.

4. The system of claim 3, wherein the phase detector comprises a binary phase detector configured to receive the input clock through the first controllable delay element and the output clock.

5. The system of claim 3, wherein the phase detector outputs a first detection signal having a first state when the clock cycle of the output clock lags the clock cycle of the input clock, and outputs a second detection signal having a second state opposite to the first state when the clock cycle of the input clock lags the clock cycle of the output clock.

6. The system of claim 5, wherein the detection circuit further comprises:
 a demultiplexer configured to demultiplex outputs of the phase detector; and
 a plurality of processing slices corresponding to the plurality of timeslots and configured to receive the demultiplexed outputs of the demultiplexer, each of the plurality of processing slices outputting a limit indicator when a counter of the processing slice reaches a high limit based on multiple high states or a low limit based on multiple low states output by the phase detector with respect to corresponding timeslots in consecutive interleaving periods.

7. The system of claim 6, wherein the actuator circuit further comprises:
 a shifting circuit configured to shift outputs of the counters of the plurality of processing slices to correspond to the corresponding timeslots; and
 a multiplexer configured to multiplex the shifted outputs of the counters from the shifting circuit and to provide a multiplexed correction signal to the first controllable delay element for adjusting the amount of the delay of the input clock in the master clock path to compensate for the periodic noise detected in the corresponding timeslots.

8. The system of claim 7, further comprising:
 a control circuit configured to receive the limit indicators from the plurality of processing slices, and to adjust a delay of a second controllable delay element in order to eliminate the limit indicators.

9. The system of claim 8, wherein the second controllable delay element is configured to delay the input clock received by the phase detector.

10. The system of claim 8, wherein the second controllable delay element is configured to delay the input clock received by a clock divider controlling the multiplexer of the actuator circuit.

11. The system of claim 1, wherein the periodic noise comprises jitter.

12. The system of claim 11, wherein the jitter is introduced, at least in part, by a clock driver in the master clock path.

13. A method for compensating for periodic noise in a time interleaved system having a plurality of phases of interest, the method comprising:
 receiving an input clock provided to a master clock path, the input clock having periodically occurring interleaving periods, each interleaving period comprising a plurality of timeslots corresponding to the plurality of phases of interest of the time interleaved system;
 receiving an output clock output by the master clock path based on the input clock, the output clock having the periodically occurring interleaving periods and each interleaving period comprising the plurality of timeslots;
 comparing the received input clock and the received output clock for each timeslot of the plurality of timeslots to detect periodic noise in the output clock introduced by the master clock path; and
 adjusting an amount of delay of the input clock in the master clock path to compensate for the detected periodic noise for each timeslot.

14. The system of claim 13, wherein the input clock comprises a plurality of clock cycles corresponding to the plurality of timeslots in each interleaving period, respectively, and wherein the delay of the input clock is adjusted for each clock cycle based on periodic noise detected in the corresponding timeslot.

15. The method of claim 13, wherein comparing the received input clock and the received output clock for each timeslot of the plurality of timeslots comprises sampling the input clock at a nominal transition point of a clock cycle, and comparing the sampled input clock with the same clock cycle in the output clock.

16. The method of claim 13, wherein the periodic noise comprises jitter.

* * * * *